United States Patent

[19]

Shie

[11] Patent Number: 5,867,372
[45] Date of Patent: Feb. 2, 1999

[54] FRAME STRUCTURE FOR MOUNTING TELECOMMUNICATIONS EQUIPMENT

[75] Inventor: Wu-Ming Shie, Chung-Li, Taiwan

[73] Assignee: Advanced Optronics Corp., Chung-Li, Taiwan

[21] Appl. No.: 835,821

[22] Filed: Apr. 16, 1997

[51] Int. Cl.⁶ ........................................................ H05K 7/14
[52] U.S. Cl. .................. 361/826; 361/825; 361/829; 361/729; 361/735; 174/52.1; 174/65 R; 174/65 G; 174/63.3; 174/68.2; 174/68.3; 174/59; 174/60; 379/325; 379/326; 379/328; 379/329; 379/330
[58] Field of Search ........................ 361/826, 825, 361/829, 729, 735; 174/59, 60, 52.1, 6 R, 65 G, 63.3, 68.2, 68.3; 379/325, 326, 328, 329, 330

[56] References Cited

U.S. PATENT DOCUMENTS

| 4,641,754 | 2/1987 | Hebel et al. | 211/26 |
| 5,208,737 | 5/1993 | Miller | 361/426 |
| 5,450,272 | 9/1995 | Van Gaal et al. | 361/690 |
| 5,521,973 | 5/1996 | Peng | 379/329 |

*Primary Examiner*—Leo P. Picard
*Assistant Examiner*—David Foster
*Attorney, Agent, or Firm*—Beveridge, DeGrandi, Weilacher & Young, LLP

[57] ABSTRACT

A frame structure for mounting telecommunications equipment including a frame, a plurality of sealing covers, a plurality of fasteners, and a plurality of wire protective sleeve. The frame having a base, two support frames, and an upper frame. A receiving recess is provided to accommodate transmission conductors (optic cables, electric cables or lead wires) of telecommunications equipment. A positioning recess formed between the plate bodies at the upper and lower covers of the inner side of the sealing covers and the fastening plates allows the sealing covers to be mounted over the edge of the inner lateral plates of the opening of the receiving recess on the support frames. A fastener is then passed into a hollowed hole of the outer lateral plate on the sealing cover and further into a fastening hole, with the plate body of the sealing cover being pressed downwardly. A press element is then pressed into a fastener body to secure the connection. The frame thus assembled may accommodate and conceal the transmission conductors led out from telecommunications equipment.

2 Claims, 7 Drawing Sheets

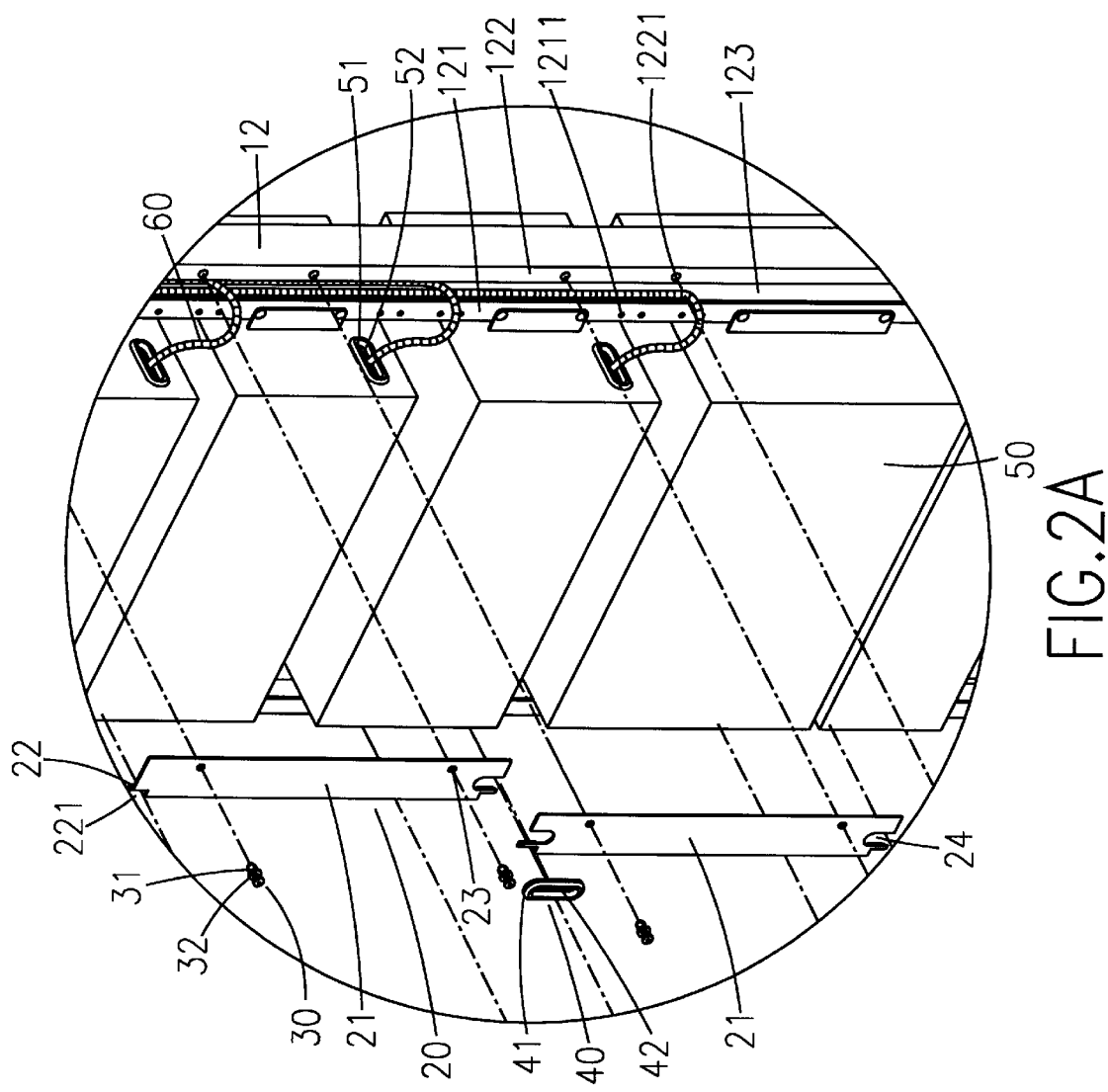

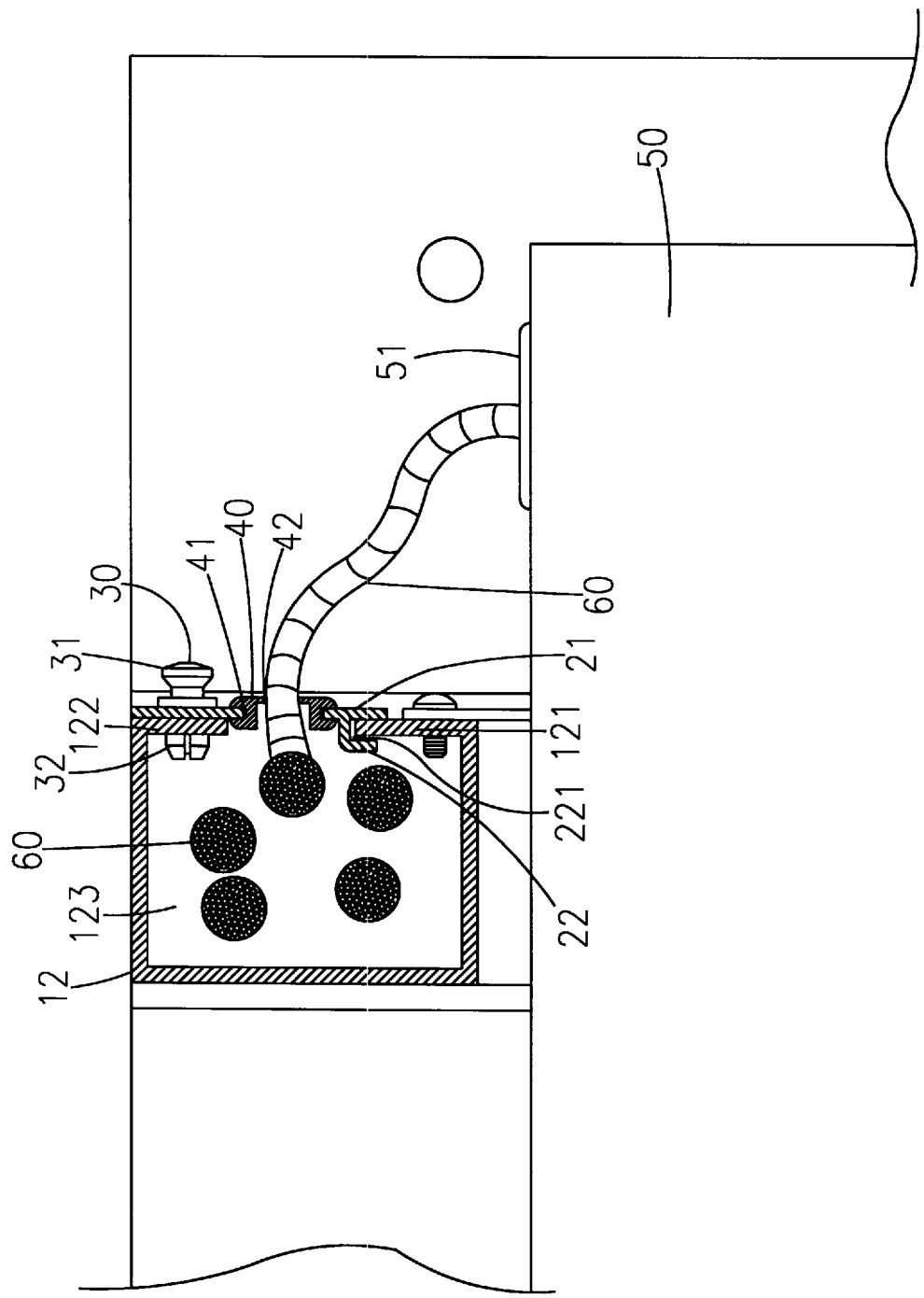

FRAME STRUCTURE FOR MOUNTING TELECOMMUNICATIONS EQUIPMENT

BACKGROUND OF THE INVENTION (a) Field of the Invention

The present invention relates generally to a frame structure for mounting the transmission conductors of telecommunications equipment, and more particularly to a frame structure for accommodating the transmission conductors of telecommunications equipment, the frame structure being pleasing in appearance, and easy to assemble.

(b) Description of the Prior Art

In existing frame structures for telecommunications equipment, the transmission conductors (such as optic cables, electric cables or lead wires) of the equipment are tied with a wire and then inserted into a securing frame protrudently provided at the upper end of the support frame from below before they are distributed to other locations or other wire holes at the other end of the equipment. The overall appearance of such conventional frame structures is therefore unsightly and the transmission conductors are vulnerable to damage. Besides, the suspended transmission conductors may be loosened from the terminals or the contact is not good.

SUMMARY OF THE INVENTION

Accordingly, a primary object of the present invention is to provide a frame structure for telecommunications equipment for accommodating the transmission conductors, which is easy to assemble, safe to use, and pleasing in appearance. In order to achieve the object, the frame structure is comprised of sealing covers, fasteners and wire protective sleeves working in cooperation with support frames of the frame.

BRIEF DESCRIPTION OF THE DRAWINGS

The foregoing and other features and advantages of the present invention will be more clearly understood from the following detailed description and the accompanying drawings, in which.

FIG. 2A is an partially enlarged elevational view of FIG. 2;

FIG. 3 is a top sectional view of the present invention in part;

DETAILED DESCRIPTION OF THE PREFERRED EMBODIMENT

Figure 1:
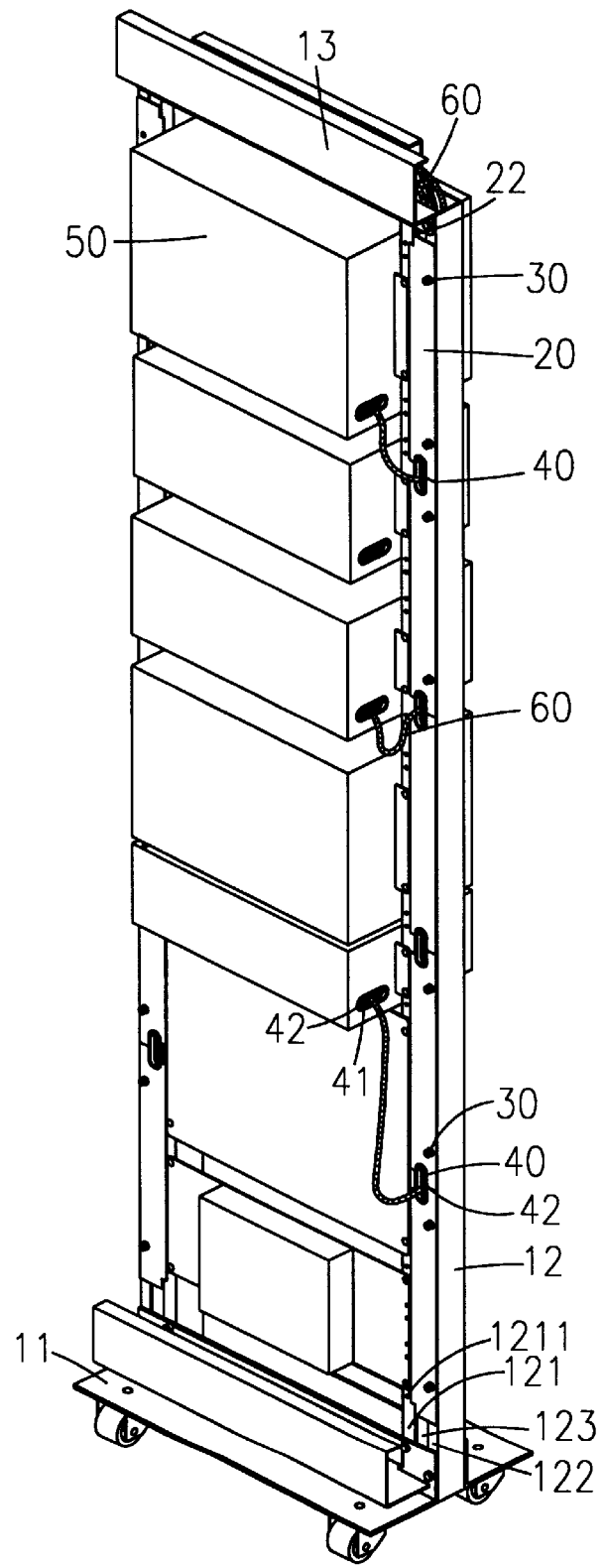
FIG. 1 is an elevational view of the present invention.
Figure 2:
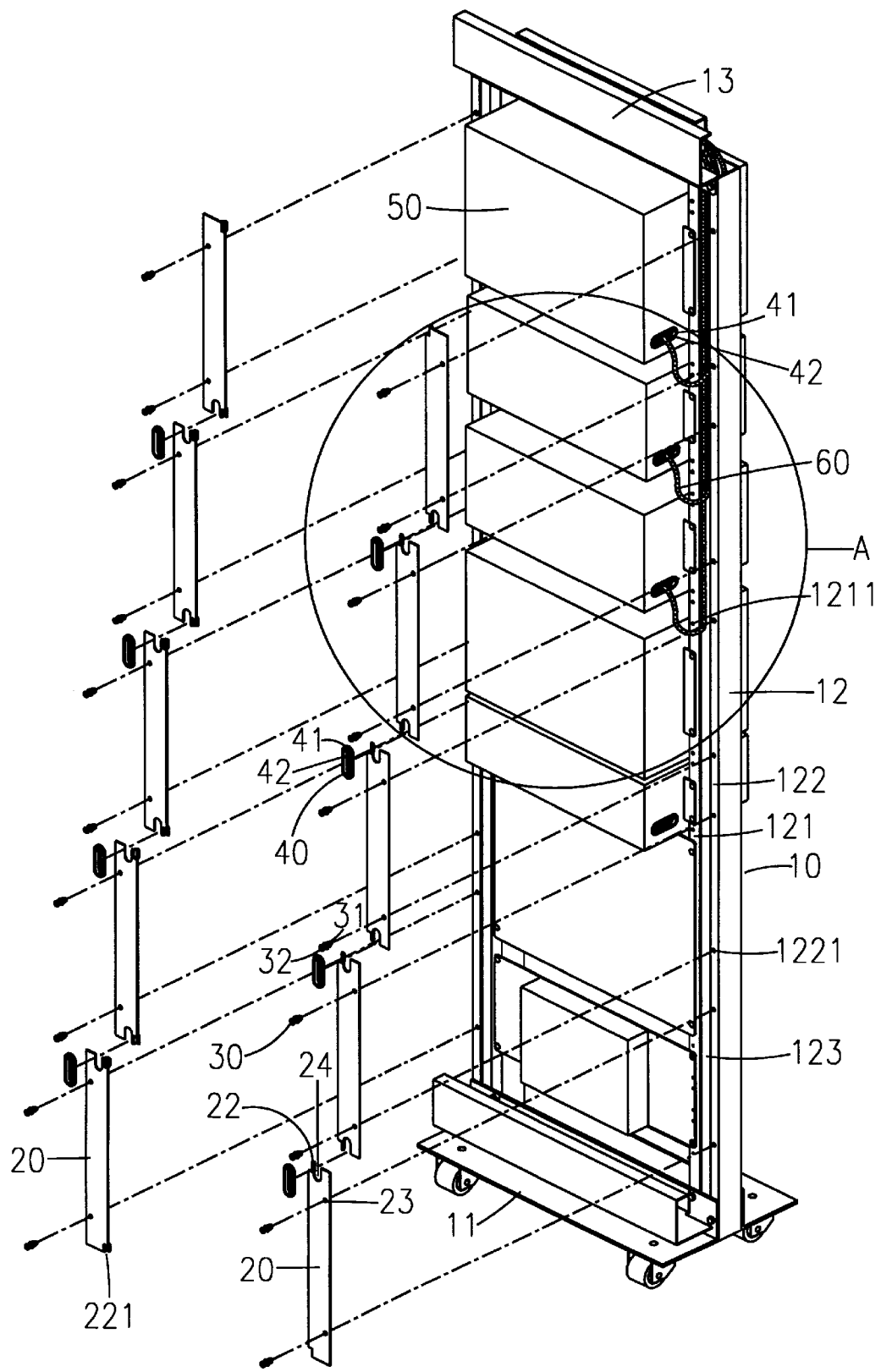
FIG. 2 is an exploded elevational view of the present invention.

With reference to FIGS. 1 and 2, the present invention essentially comprises a frame 10, a plurality of sealing covers 20, a plurality of fasteners 30, and a plurality of wire protective sleeves 40. The essential structure of the present invention is described below in detail.

The frame 10 is a rectangular hollow frame structure comprising a base 11 and a couple of support frames 12 each of which is locked to a respective side of the base 11. An upper frame 13 is secured mounted at the top ends of the support frames 12. Each support frame 12 is a hollow rectangular columnar structure with a longitudinally oriented through rectangular receiving recess 123 at a front end thereof. Either side of the receiving recess 123 has an inner lateral plate 121 and an outer lateral plate 122. The inner lateral plate 121 has a plurality of screw holes 1211 at an upper portion thereof to facilitate mounting of ordinary telecommunications equipment 50 thereon. The outer lateral plates 122 has a plurality of fastening holes 1221 at an upper portion thereof. The respective fasteners 30 may be inserted into the respective fastening holes 1221 to lock the respective sealing covers 20 onto the outer lateral plates 122.

Figure 4:
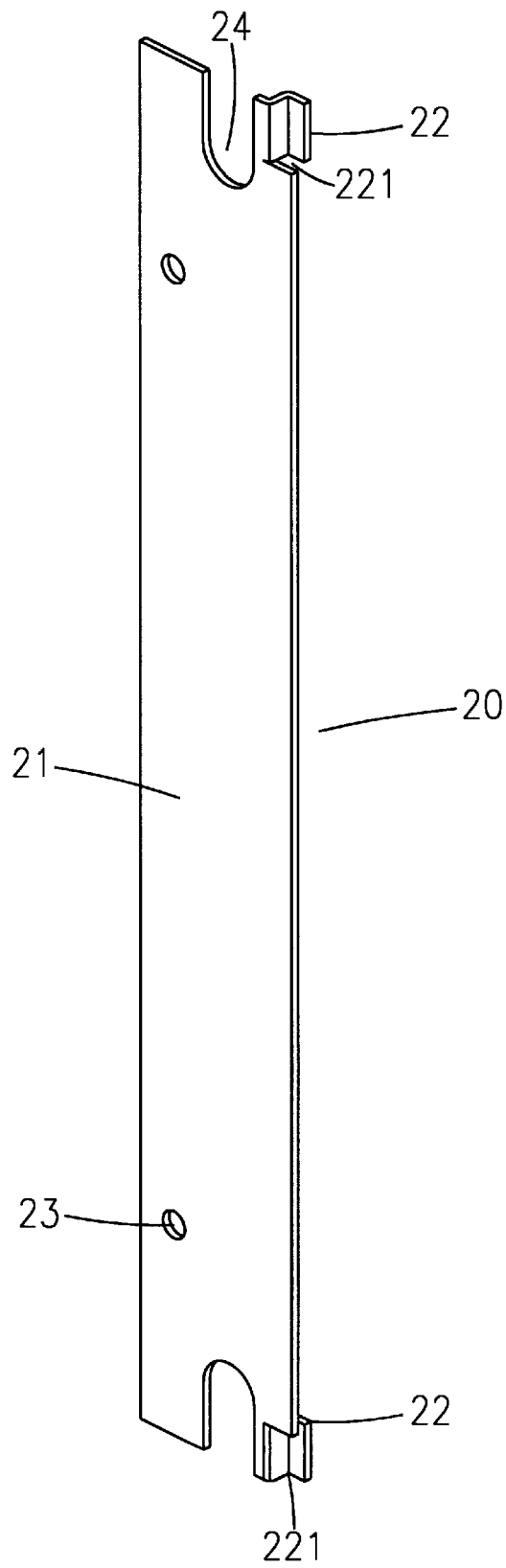
FIG. 4 is an elevational view of the sealing cover of the present invention.

Referring to FIGS. 2A and 4, the sealing covers 20 are each a rectangular plate structure having a plate body 21. The upper and lower corners of the inner side of each plate body 21 are bent rearwardly to form a fastening plate 22, such that the plate body 21 and the fastening plate 22 together define a positioning recess 221 to facilitate mounting over and positioning on the edge of the inner lateral plate 121 in the support frame 12. The surface of the plate body 21 is further provided with a hollowed hole 23 to allow passage of the fastener 30 so that the plate body 21 may be secured onto the support frame 12. Besides, the upper and lower ends of the plate body 21 are respectively provided with a slot 24 of a size smaller than half of that of an annular positioning groove 41 of the wire protective sleeve 40. By means of the slots 24 at the upper and lower ends of adjacent sealing covers 20, the annular positioning grooves 41 of the respective wire protective sleeves 40 may be fitted onto the sealing covers 20, so that a transmission conductor 60 may pass through each wire protective sleeve 40, which will protect the transmission conduct 60 and insulate direct contact between the support frame 12 and the transmission conductor 60.

Figure 5:
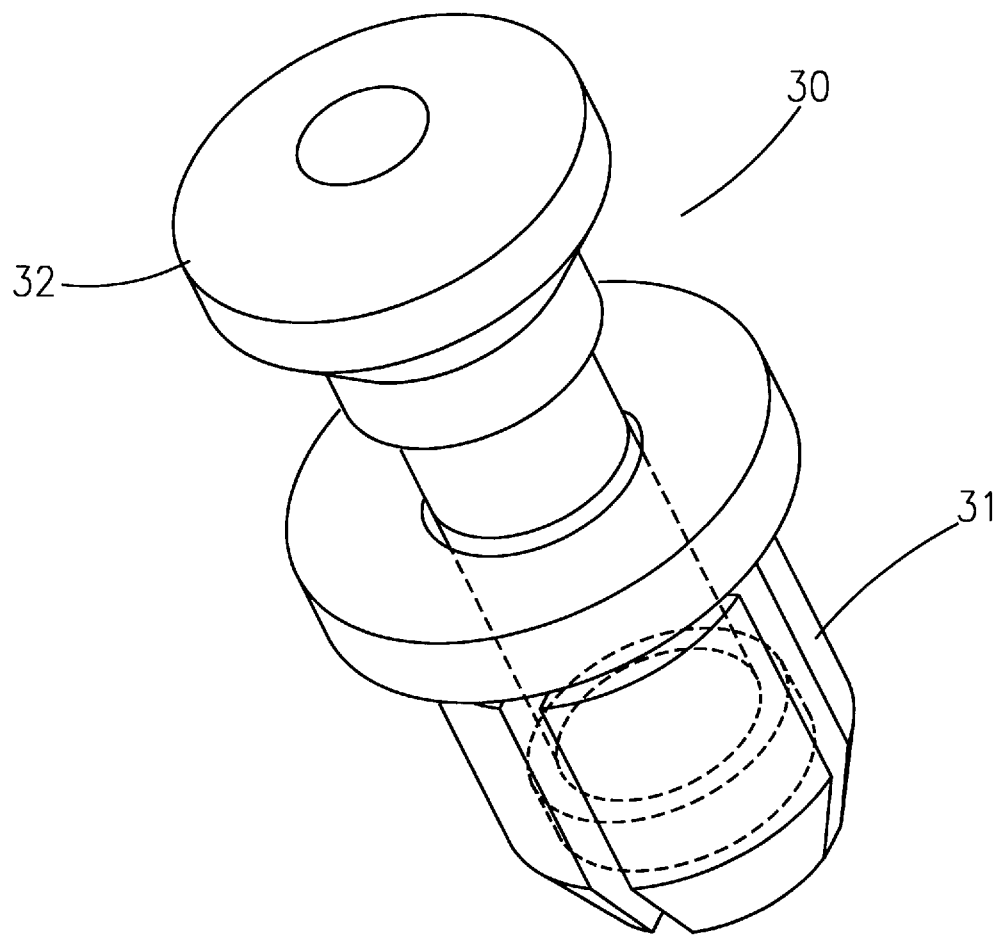
FIG. 5 is an elevational perspective view of the fastener of the present invention.

With reference to FIGS. 2A and 5, the fasteners 30 are used to fasten the sealing covers 20 to the support frames 12. Each fastener 30 comprises a fastener body 31 passing into the hollowed hole 23 on the sealing cover 20 and into the fastening hole 1221 on the outer lateral plate 122 of the support frame 12, and a press element 32 for pressing the fastener body 31 into position.

Figure 6:
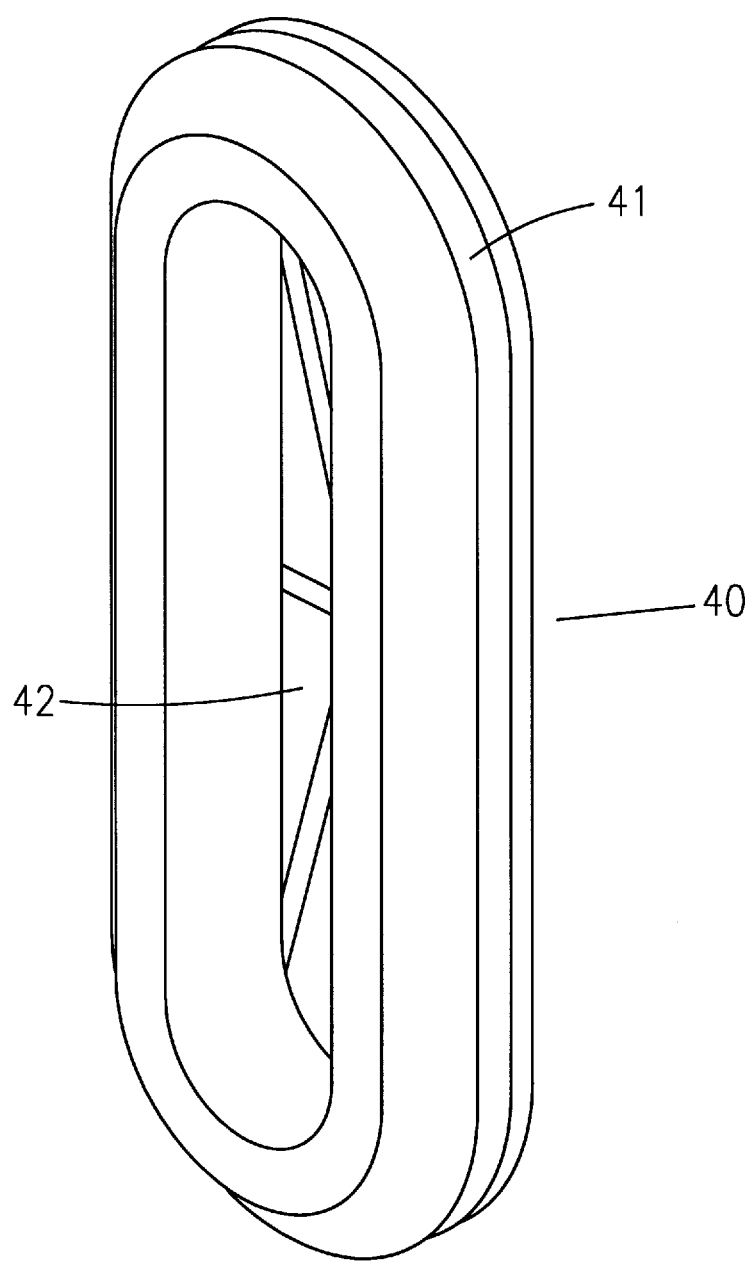
FIG. 6 is an elevational view of the wire protective cover of the present invention.

Referring to FIGS. 2A and 6, the wire protective covers 40 are soft insulated sleeve structures for securing into the slots 24 on adjacent sealing covers 20. Each protective sleeve 40 has an annular positioning groove 41 at its outer periphery so that it maybe secured on the inner periphery of the slots 24 of the sealing covers 20, and a wire hole 42 at the center.

Reference is now made to FIGS. 2A and 3, the frame 10 according to the present invention is a hollow frame structure comprised of the base 11 having two side support frames 12 and the upper frame 13. The screw holes 1211 at the inner lateral plates 121 at the front opening of the support frames 12 are provided so that ordinary telecommunications equipment 50 may be mounted with screws on the two support frames 12. During wiring, the transmission conductors 60 are passed into wire holes 42, 52 of two wire protective sleeves 40 and 51. Then, by means of the positioning recesses 221 formed between the fastening plates 22 at the upper and lower edges of the inner side of the sealing covers 20 and the plate bodies 21, the transmission conducts 60 are mounted over the edge of the inner lateral plates 121 of the receiving recesses 123 on the support frames 12. The fastener body 31 at the lower end of the fastener 30 is then passed into the hollowed hole 23 of the sealing cover 20 and further into the fastening hole 1221 of the outer lateral plate 122 of the support frame 12, with the press element 32 pressed into position. In this way, the sealing cover 20 may be directly secured at the upper side of the opening of the receiving recess 123 of the support frame 12. At this point, the annular positioning grooves 41 at the edge of the wire protective sleeve 40 into which the transmission conductor 60 has been passed is fitted onto the edge of the slot 24 on the upper and lower ends of adjacent sealing covers 20. The respective sealing covers 20 are likewise assembled to the two support frames 12 to accomplish assembly of the present invention.

By means of the present invention as described above, transmission conducts (such as optic cables, electric cables or lead wires) lead out from the telecommunications equipment secured on a frame directly accommodated in the receiving recesses of the support frames. The sealing covers closing the openings of the support frames achieve a pleasing appearance and prevent the transmission conductors (optic cables, electric cables or lead wires) from being damaged or loosening when subjected to impacts.

Although the present invention has been illustrated and described with reference to the preferred embodiment thereof, it should be understood that it is in no way limited to the details of such embodiment but is capable of numerous modifications within the scope of the appended claims.

What is claimed is:

1. A frame structure for mounting telecommunications equipment, comprising
    a frame,
    a plurality of sealing covers,
    a plurality of fasteners, and
    a plurality of wire protective sleeves each having a wire hole passing therethrough; said frame being a rectangular frame structure having a base, two support frames, and an upper frame, wherein
    a plurality of screw holes are formed in an inner lateral plate at either side of an opening at a front end of each of said support frames so that telecommunications equipment may be locked to said support frames,
    a transmission conductor of the telecommunications equipment being passed into the wire holes of two wire protective sleeves during internal wiring and mounted over the edge of said inner lateral plate of a receiving recess on said support frames by means of a gap formed between fastening plates at the upper and lower edges of the inner side of said sealing covers and plate bodies of said sealing covers,
    a fastening body at a lower end of each fastener being passed into a hollowed hole of each sealing cover and further into a fastening hole of the respective outer lateral plate of said support frames, with a press element pressed into position, so that said sealing covers may be directly secured onto both sides of the opening of said receiving recess of said support frames,
    an annular positioning groove of each protective sleeve having the transmission conductor passed therethrough being fitted onto the edge of the slots at the upper and lower ends of adjacent sealing covers for holding and concealing the transmission conductor led out from the telecommunications equipment at said support frames.

2. The frame structure as claimed in claim 1, wherein said fasteners may be ordinary screws or any other fastening means.

* * * * *